(12) United States Patent
Bietsch et al.

(10) Patent No.: US 7,041,232 B2
(45) Date of Patent: May 9, 2006

(54) SELECTIVE ETCHING OF SUBSTRATES WITH CONTROL OF THE ETCH PROFILE

(75) Inventors: Alexander Bietsch, Thalwil (CH); Emmanuel Delamarche, Adliswil (CH); Bruno Michel, Adliswil (CH); Heinz Schmid, Waedenswil (CH); Matthias Geisler, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 772 days.

(21) Appl. No.: 10/081,860

(22) Filed: Feb. 22, 2002

(65) Prior Publication Data

US 2004/0200575 A1    Oct. 14, 2004

(30) Foreign Application Priority Data

Mar. 26, 2001   (EP)   .................................. 01810300

(51) Int. Cl.
*C09K 13/00* (2006.01)
*C09K 13/06* (2006.01)
*H01L 21/306* (2006.01)

(52) U.S. Cl. ..................... 252/79.1; 252/79.4; 438/745
(58) Field of Classification Search ............... 252/79.1, 252/79.4; 438/745
See application file for complete search history.

(56) References Cited

U.S. PATENT DOCUMENTS

| 5,292,445 A | * | 3/1994 | Fjare et al. ................. 252/79.5 |
| 5,885,753 A | * | 3/1999 | Crooks et al. .............. 430/325 |
| 6,060,256 A | * | 5/2000 | Everhart et al. ............ 435/7.21 |
| 6,114,099 A | * | 9/2000 | Liu et al. ..................... 430/324 |

* cited by examiner

Primary Examiner—Nadine G. Norton
Assistant Examiner—Lynette T. Umez-Eronini
(74) Attorney, Agent, or Firm—Thomas A. Beck; Daniel P. Morris

(57) ABSTRACT

A wet etching system for selectively patterning substrates having regions covered with self-assembled monolayers (SAM) thereby controlling the etch profile. The system contains a) a liquid etching solution; and b) at least one additive to the liquid etching solution having a higher affinity to the regions of the substrate covered with the SAMs than to the other regions of the substrate. Also provided is a method of selectively patterning substrates having regions covered with self-assembled monolayers (SAMs), thereby controlling the etch profile, the method consisting of the steps of a) providing a liquid etching solution; b) adding at least one additive to said etching solution having a higher affinity to the regions of the substrate covered with the SAMs than to the other regions of the substrate; and c) etching said substrate with said liquid etching solution containing at least one additive.

1 Claim, 6 Drawing Sheets

FIG.1A
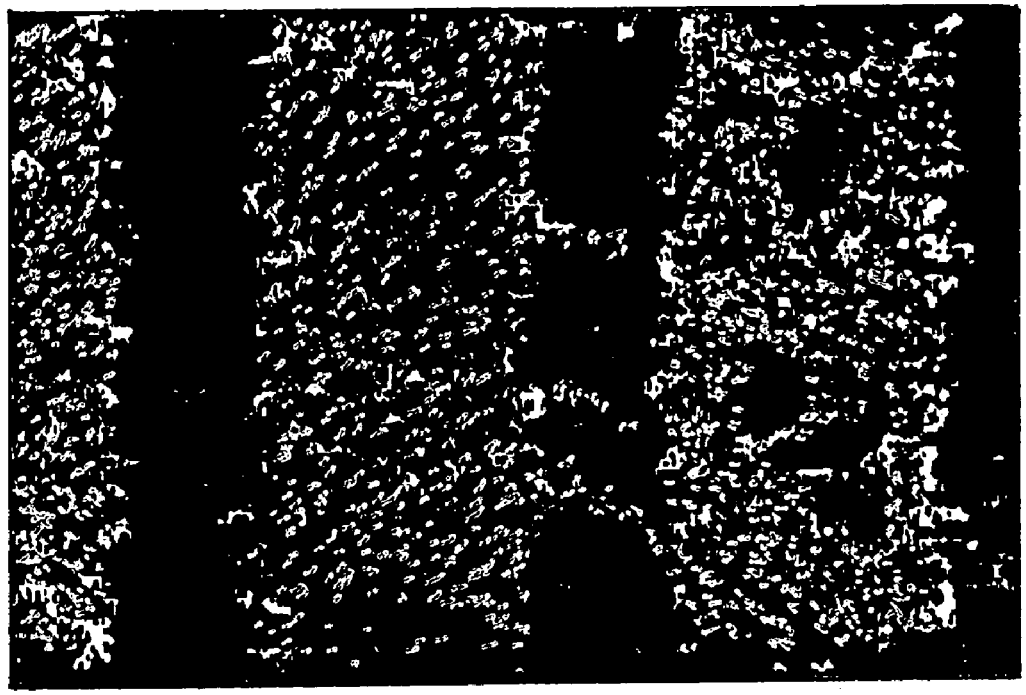
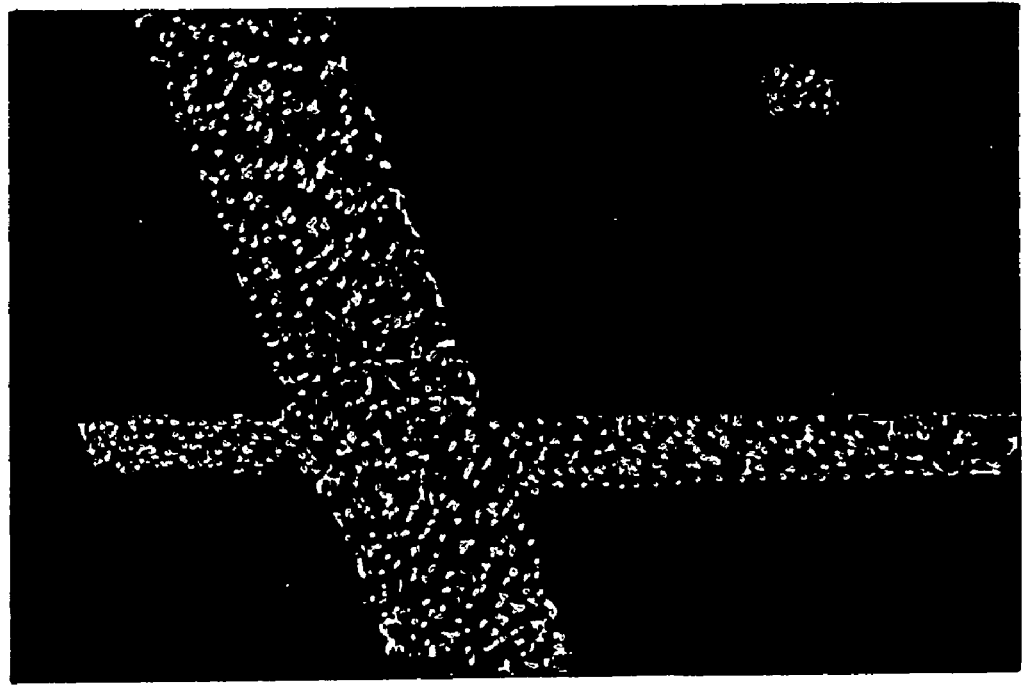
FIG.1B

FIG.2A
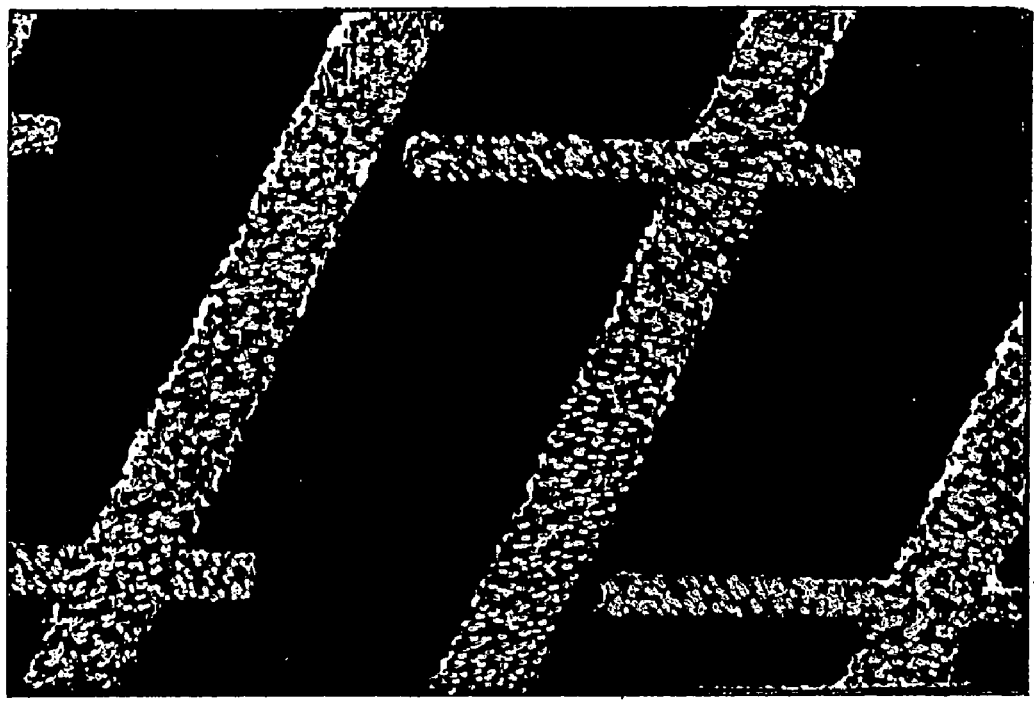
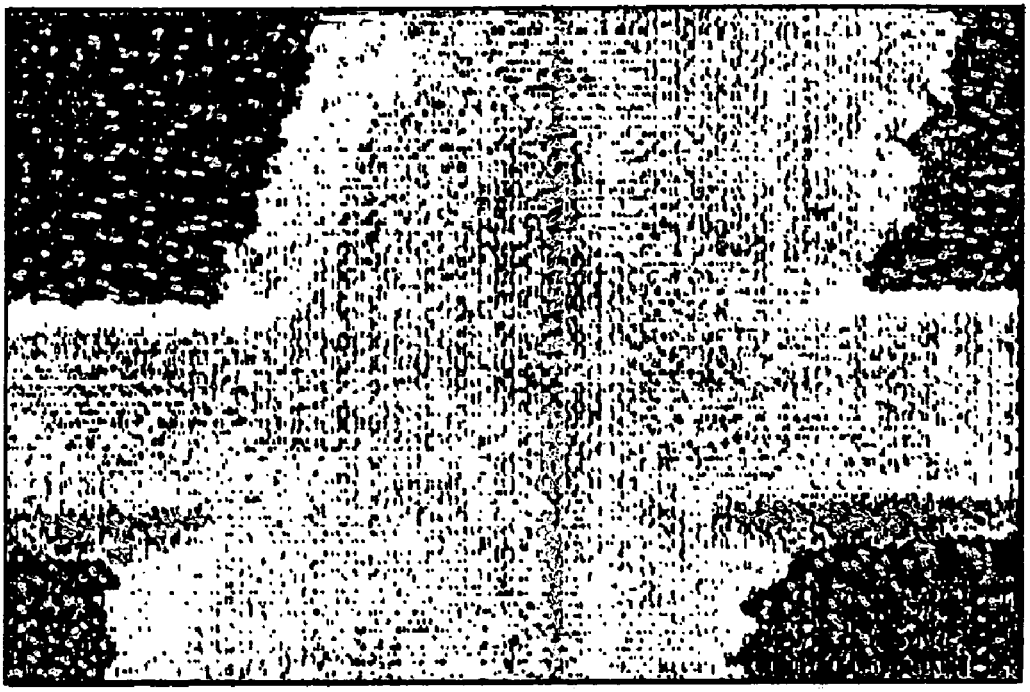
FIG.2B

FIG.3C
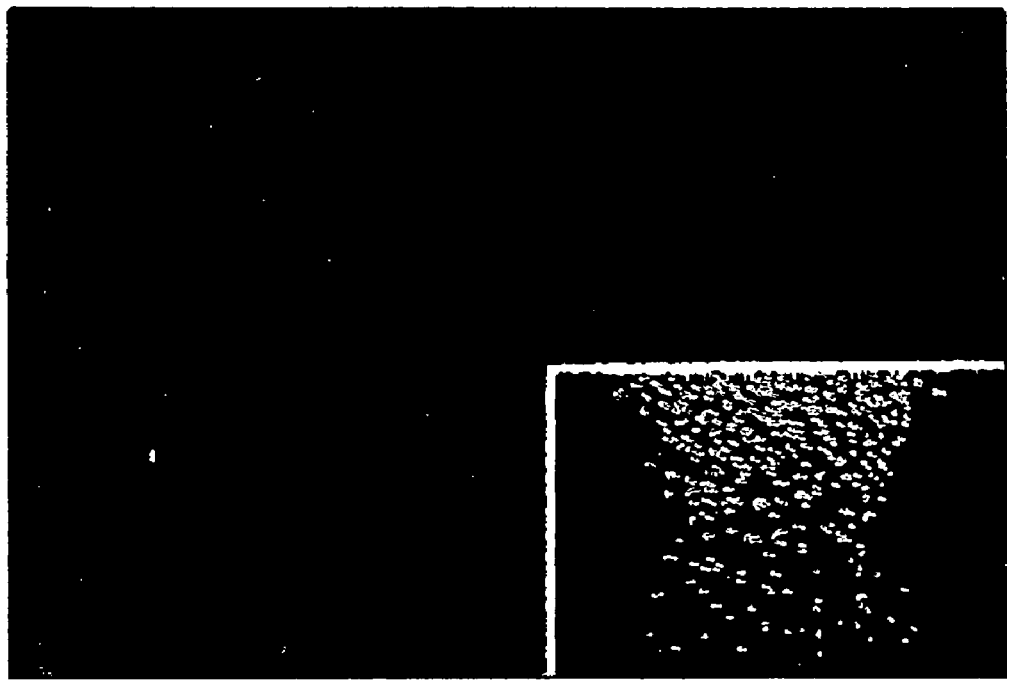
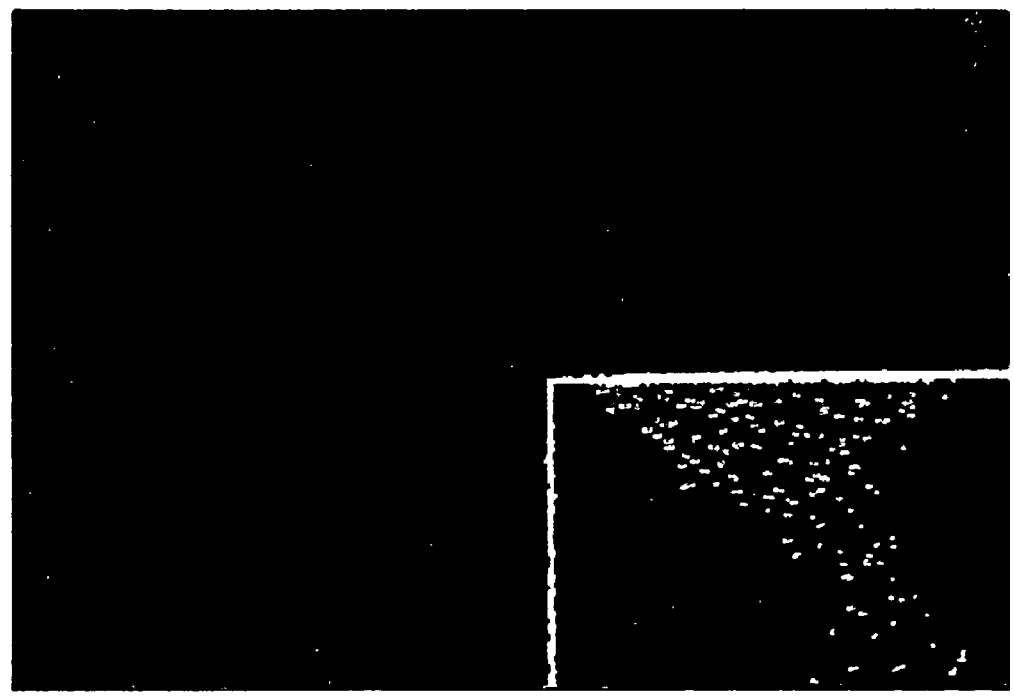
FIG.3D

FIG.4A
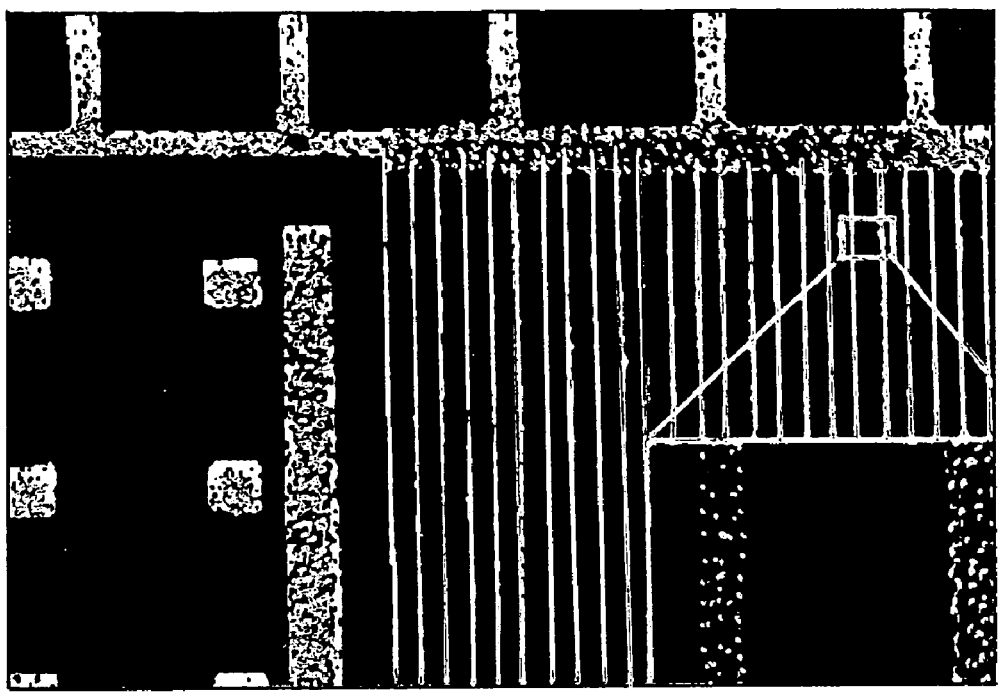
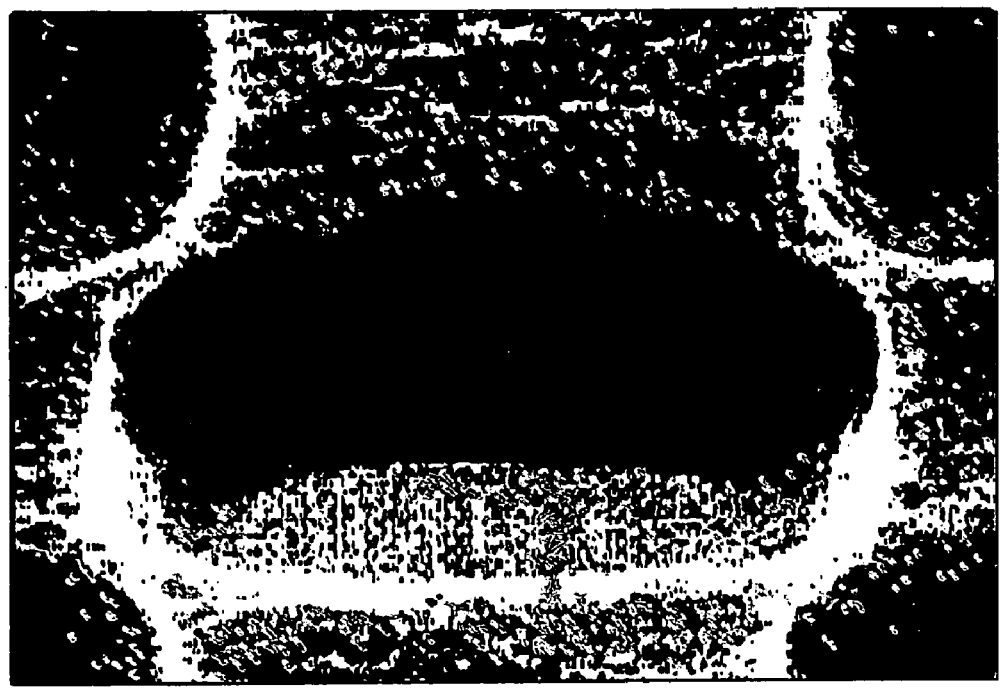
FIG.4B

SELECTIVE ETCHING OF SUBSTRATES WITH CONTROL OF THE ETCH PROFILE

FIELD OF THE INVENTION

The present invention in general relates to forming small structures on substrates using lithography. More specifically, the invention relates to the improvement of feature definition and the manufacture of tapered structures. Still more specifically, the invention pertains to the etching of substrates having regions covered locally with self-assembled monolayers (SAMs).

BACKGROUND OF THE INVENTION, PRIOR ART

The fabrication of small structures, conductive or insulating, on substrates using lithography is very important, e.g., for the fabrication of microcircuits in microelectronic industry, for the fabrication of sensors, or for the manufacture of displays.

Photolithography

Photolithography is a well-known technique used to structure substrates or layers on a substrate. Patterning a layer using photolithography involves several steps. First, the layer is coated with a photosensitive layer called the photoresist. This resist is then exposed through a patterned mask with light. Depending on the tone of the resist, the resist can be developed by dissolving away the exposed areas (positive resist) or the unexposed parts of the resist can be removed (negative resist).

The patterned resist acts then as a mask to protect its substrate from etchants. Photolithography is the standard technique used to fabricate microcircuits by patterning substrates or layers on a substrate to form the various parts of integrated circuits (cf. "Semiconductor Devices, Physics and Technology" page 428, by S. M. Sze, Wiley and Sons, 1985, NY). Lithography is used worldwide by semiconductor manufacturers and is of extreme importance in technology.

Contrast and Resolution in Lithography

The contrast and the smallest features of a pattern represent two important characteristics of a lithographic technique. An ideal contrast corresponds to the entire removal of the original layer where desired without damaging the rest of this layer. The resolution is defined by the smallest achievable patterns and the edge resolution of these patterns. In practice, all lithographic techniques have a limited resolution and contrast due to imperfections in the mask and the instrumentation used to expose the resist with light and due to the process to develop the resist and the etch chemistry.

Etching the Substrate

The resist and the etch chemistry used to pattern one type of substrate must be selected carefully and must be compatible. The resist usually consists of a polymeric material with a thickness of the order of 1 micrometer or more and its function is to physically block etchants from reaching and dissolving the underlying substrate. Etching can proceed using gaseous etchants (dry etch) or using a solution containing etchants (wet etch). A dry etch is probably more controllable than a wet etch but wet etching is economically more attractive and necessary when the chemicals resulting from dry etching a substrate are not gaseous but accumulate on the substrate.

Many types of etching baths have been developed to wet etch metallic, semiconducting or insulating substrates. These baths are generally prepared by dissolving etchant species and salts in water or in a solvent. The pH, the temperature and the stirring of the bath are usually important parameters for wet etching. The substrate can be immersed into the bath for etching for a given time or, alternatively, the etch solution can be sprayed over the substrate. Some chemicals in the bath might be consumed during the etch and the bath then may be replenished or replaced.

Self-Assembled Monolayers

It is known that self-assembled monolayers (SAMs) can form on, e.g., gold or other metals. SAMs result from the spontaneous adsorption of molecules from a solution or a gas onto a substrate. SAMs-forming molecules comprise a headgroup which interacts with the substrate and the remaining part of the molecule usually acquires some order from its interaction with neighboring molecules in the monolayer. SAMs can form on a variety of surfaces depending on the headgroup-substrate chemistry. For example, alkanethiols and disulfides can form SAMs on Au, Ag, Pd and Cu, and silanes on silicon oxide, for example. The preparation, characterization and utilization of SAMs is an important field of research because these layers represent a model system to change and control the properties of surfaces. It is possible to change the wetting, lubrication and corrosion properties of a substrate covered with a SAM, for example.

Patterning SAMs

There is a number of techniques known for patterning SAMs on a surface. For most of these techniques, a first step consists in covering a substrate entirely with a SAM. In a second step, the SAM is removed in some areas using ultraviolet light, a beam of electrons, bombarded atoms, or the probe of a scanning probe microscope (scanning tunneling microscope or atomic force microscope). Another technique is called microcontact printing (MCP), and will be described in more detail below. MCP directs the formation of the SAM where desired on the substrate during a printing step. The patterned SAM resulting from these techniques serves as a resist for selectively etching the substrate.

Micro Contact Printing (MCP)

MCP employs a stamp replicated from a mold to localize the formation of a SAM on a substrate during printing. There are many constraints on the material used for forming the stamp. The stamp must be soft to ensure good contact with the substrate during printing, yet it must be mechanically stable. PDMS is a material of choice to form stamps because it fulfills in part these conditions and PDMS stamps can be inked with solutions of alkanethiols in ethanol. After evaporation of the ethanol and drying of the stamp, some alkanethiols remain in and on the stamp. The patterning of such a stamp is disclosed, e.g., in EP-B-0 784 543.

MCP works best for printing alkanethiols on Au and has been extended with more difficulties to the printing of alkanethiols on Ag, Cu and of trichlorosilanes on silicon oxide (see, e.g., Y. Xia and G. M. Whitesides (1999), Angew. Chem. Int., Ed. 37, 550–575). It is relatively simple to print alkanethiols on Au to change some of the properties of the substrate like wetting but it is considerably more difficult to employ MCP for printing and etching Au with high contrast and resolution for the following reasons.

Difficulties of Using SAMs as Resists

The ability of SAMs to protect a substrate as compared to a conventional photoresist is limited for several reasons. An ideal SAM for providing a good etch barrier to a substrate should be as thick, ordered and dense as possible. One first drawback of using SAms as resists derives from the impossibility to prepare SAMs having a thickness greater than a few nanometers. The formation of a thick SAM would require chemisorbing a long molecule but long molecules tend to coil spontaneously making the chemisorbing headgroup less accessible for adsorption onto the substrate. In addition, long molecules have difficulties forming ordered and dense monolayers, because they have many more stable conformations than short molecules and not all conformations do lead to a good order in the SAM. Forming thick and ordered SAMs is desirable, however, to prevent the diffusion of etchants through disordered regions of the SAMs. It has also been found that the etch protection provided-by SAMs formed with linear alkanethiols of the general formula HS—$(CH_2)_{n-1}$—$CH_3$ increases with n>12 (thick enough barrier) but decreases again for n>20 (see, e.g., X.-M. Zhao et al., (1996), Langmuir 12, 3257–3264).

There exist several examples of etch chemistries for which the rate of dissolution of the bare substrate as compared to the dissolution of the substrate covered with a SAM is higher. Au can be etched with a solution containing cyanide and oxygen but it is not easily etched when it is covered with a monolayer of alkanethiols, for example. Other etch chemistries have been investigated for thin Au substrates protected by SAMs formed from solution or using MCP. Some etch chemistries have also been investigated for Ag and Cu substrates (Xia et al., (1995), Chem. Mater. 7, 2332–2337).

It is known that the order and protection of SAMs on rough substrates is worse than for SAMs on smooth substrates. Practically, rough substrates covered with SAMs are not well protected from corrosion or etchants and substrates like Ag and Cu are rougher than Au due to their crystalline structure. Protecting Ag and Cu substrates from etchants using SAMs is thus more problematic than for Au substrates. The roughness of a substrate increases with its thickness. Consequently, it is more difficult to protect thick substrates than thin substrates with SAMs.

The chemical composition of a substrate influences the quality of the SAMs formed on them. A metallic substrate having impurities (atoms or molecules) on its surface can prevent the adsorption of molecules which can lead to local defects in a SAM. Au contaminated by airborne sulfur-containing molecules is an example. Another example is the native oxide on Ag and Cu surfaces exposed to air as well as the presence of foreign atoms like, for example, Cr, on the surface of Au due to diffusion from an underlayer. Such metal impurities or oxides interfere with the formation of a SAM and lower the etch protection conferred to a substrate by the SAM.

The etch protection of a substrate by a SAM also depends on the conditions of formation of this SAM. Some SAM-forming molecules are very reactive and side-react with water or contaminants during the SAM formation. This can lead to defects in a monolayer as well and is, e.g., the case with trichlorosilanes which are used to form SAMs on silicon dioxide surfaces. Molecules in SAMs can be damaged by ambient ultraviolet light, and by oxygen leading to defects in monolayers. This is well known and studied for SAMs of alkanethiols on Au for which ambient ultraviolet light from lamps and oxygen from air degrade the chemisorbed sulfurs into sulfonates moieties (see, e.g., Li et al., (1992), J. Am. Chem. Soc., 114, 2428–2432). The strength of interaction of the degraded molecules with the Au substrate is weakened and the degraded molecules are soluble in etch baths. This leads to loss of molecules from the SAM, which creates defects in the monolayer through which etchants can penetrate. Exposing a substrate covered with a SAM to heat, vacuum or rinses with solvents can also lead to loss of molecules from the monolayer and to etch pits of the substrate where it is not desirable.

Additionally, patterning SAMs on a surface does suffer like conventional resists from not having an ideal contrast (see, e.g., Delamarche et al., (1998), J. Phys. Chem. B, 102, 3324–3334). During the operations of adding a monolayer onto regions of a substrate, some molecules can deposit onto the substrate at undesired locations. These molecules can retard the etch in these regions even if they do not form a complete monolayer. Inversely, if the SAM is patterned by its selective removal, molecules might also be removed from adjacent areas, which can lower the etch resistance of the monolayer in these regions.

Difficulties of Using MCP to Pattern SAMs

Some specific problems exist when MCP is used to pattern a monolayer on a substrate. Only a few types of molecules can be used for MCP because the SAM-forming molecules must be soluble in solvents compatible with stamps. It is widely accepted that molecules soluble in water or ethanol can be used for inking a stamp. Other solvents swell and distort stamps too much for being of technological interest and particularly for the fabrication of microcircuits for which patterns must be as accurate as possible. Alkanethiols which form well protective monolayers on Au are not soluble in water. This means that MCP of alkanethiols on Au is restricted to the usage of alkanethiols compatible with the stamp or the MCP technique but these thiols are not necessarily optimal in term of protection of the Au surface for etching.

The formation of a well protective SAM on Au, Ag or Cu using MCP necessitates to provide enough thiol reactants from the stamp and a printing duration long enough to form a patterned SAM as good as possible. The amount of thiols present on the stamp prior to inking and the printing duration must be well optimized to prevent the diffusion of thiols away from the print areas. It is known that preventing diffusion of the thiols over the printed substrate requires to limit the amount of thiols present on the stamp and the print duration, which for practical application prevents to form fully complete printed SAMs.

Another problem for etching a layer protected by a SAM is that etching of this layer will start at defects in the SAM and propagate in the directions of etching. This considerably enlarges initial defects in the SAM even when they are very small in dimension at the beginning of the etch.

This situation worsens when MCP is used to print on Ag and Cu because these surfaces tend to be covered with a film of oxide. Due to this oxide, a fraction of the thiols provided by the stamp do not take part in the formation of SAM but react unproductively with the metallic oxide. The conditions used to ink the stamp, the printing duration and the amount of oxide present on the substrate make it unlikely to provide enough molecules to print a complete and well protective SAM on the substrate.

Another drawback of MCP is that the amount of thiols inked onto a stamp can vary locally depending on the inking method and the pattern present on the surface of the stamp (see, e.g., Libioulle et al., (1999), Langmuir 15, 300–304). The transfer of thiols from the ink solution into the stamp depends on the interface of contact between the stamp and the solution. This interface varies with the geometry of the pattern of the stamp. This effect is well known and called the "geometric effect". An important consequence is that during printing the local concentration of thiols and the release of thiols from the stamp is variable. This leads to the formation of SAMs onto the printed substrate with varying degree of completion and with varying etch resistance, and is thus very detrimental to the formation of patterns having structures with different sizes and shapes like it is necessary to have for designing microcircuits. One solution to this problem could be to print the entire pattern in several steps using different conditions depending on the type of subpattern being printed. This approach would have reduced yields, however, and would be costly.

Taper

It may be desirable to control the profile of etched structures in some cases. In some applications like for the formation of conductive lines for displays, it is essential to have a tapered edge of the lines and elements forming the first pattern on the substrate. The taper allows for a good and smooth coverage of the pattern by additional layers. It is well known that the edge profile usually obtained by etching a substrate having a pattern of resist is a recessed edge. This profile corresponds to a negative or sometimes curved taper and is due to an underetch of the substrate below the resist. With such a profile, it is not possible to deposit an additional layer with good coverage and without having a gas or liquid trapped in cavities. It is well known that such a problem leads to defects in the final device.

Controlling and achieving a taper is difficult and restricted to a few cases. A crystalline layer can be etched with a controlled edge profile when the etch chemistry used is anisotropic, i.e. the etch reaction depends on the crystalline orientation of the layer. This method works for crystalline substrates like Si single crystal wafers but not for amorphous substrates like glass. Another technique to achieve a taper is to add a layer on top of an existing layer, which etches faster than the underlayer. The faster etch of the top layer widens the area of the underneath layer exposed to the etch, which results in taper. This strategy, however, shows an important drawback in that it requires the costly deposition of an additional layer and this layer must also be compatible with both the underlayer and the overlayer and the metallurgy of the device in general. The additional layer must etch faster than the underlayer, what, in turn, considerably reduces the chance of having a solution for a particular case. Another possibility to achieve a taper is to employ a reactive ion etcher. In this case, the etch proceeds in the gas phase, under reduced pressure, and the patterned resist is reflowed during the etch to vary the areas of the substrate exposed to gaseous etchants. This strategy is limited to materials which can be etched in the dry phase and it is costly due to the complex instrumentation it requires.

Blocking a Gold Electrode Covered with a Monolayer

M. French and S. E. Creager in Langmuir 1998, 14, 2129–2133, "Enhanced Barrier Properties of Alkanethiol-Coated Gold Electrodes by 1-Octanol in Solution", describe the fact that the barrier properties of alkanethiol-coated gold electrodes are enhanced when the surfactant 1-octanol is present in the aqueous electrolyte solution surrounding the electrode: oxidation on the electrode surface of ferrocyanide from solution is largely suppressed and the oxidation of the gold electrode is shifted towards a more positive potential (vs the Ag/AgCl reference electrode) in an octanol-saturated buffer at pH 5. The enhanced barrier properties are thought to be caused by a thin layer of octanol atop the alkanethiol monolayer. The octanol fills in defects in the alkanethiol monolayer and increases the overall thickness of the barrier layer.

It is clear from the above mentioned reasons that SAMs cannot be formed or patterned on a substrate as to form an ideal resist. It is also clear that many parameters must be taken into account for producing high quality patterns with a surface protected by SAMs. It is clear as well that applications typical of lithography necessitate high quality patterns.

SUMMARY OF THE INVENTION

It is therefore an object of the present invention to provide an etch system and method for structuring substrates having regions covered with SAMs.

It is still another object of the present invention to provide such a method where the etch chemistry is capable of etching a layer with a control of the edge profile.

Yet another object of the present invention is to provide a method that is able to provide controllable tapered structures.

These and other objects and advantages are achieved by the system and the methods described hereinafter.

BRIEF DESCRIPTION OF THE DRAWINGS

The invention will be described in more detail hereinafter in connection with the drawings, in which FIGS. 1A and 1B are scanning electron microscope images of microcontact printed Au and microcontact printed Cu substrates after being etched by an etch bath according to prior art;

FIGS. 2A and 2B are scanning electron microscope images of a microcontact printed Cu substrate after being etched by an etch bath according to the invention;

FIGS. 3A to 3D are scanning electron microscope images of a patterned Au substrate microcontact printed with a PDMS stamp and etched in a cyanide/oxygen etch bath with and without an additive;

FIGS. 4A and 4B are scanning electron microscope images of Cu substrates etched according to a second embodiment of the invention.

DETAILED DESCRIPTION OF THE PREFERRED EMBODIMENT

Figure 3A:

Few etching systems are known for etching substrates covered in parts with SAMs. The cyanide/oxygen etch chemistry is the most published and most reasonable one, but it does not lead to acceptable results when, e.g., used with Au substrates. It has been shown that it leads to too many defects, it is too slow and it is not selective enough to satisfactorily etch thick (>20 nm) Au substrates. In addition, it does not work well for Cu substrates.

The scanning electron microscope images in FIG. 1 show the result of immersing a microcontact printed Au (FIG. 1A) and a microcontact printed Cu (FIG. 1B) substrate into a well known cyanide/oxygen etch bath according to the state of the art. The Au sample was prepared by first evaporating 1 nm of Ti on a Si wafer and by subsequently evaporating 100 nm of Au. A micropatterned stamp made of poly (dimethylsiloxane) was inked for 30 s with a 0.2 mM solution of eicosanethiol ($HS-(CH_2)_{19}-CH_3$) in ethanol. The stamp was then dried under a stream of nitrogen and printed by hand onto the Au substrate for 3 min. The printed Au sample was then immersed in a cyanide/oxygen-type of etch bath having the following chemical composition: NaOH/KCl (3.725 g of KCl and 0.480 g of NaOH per liter of deionized water) at pH 12 in deionized water and 0.1 M KCN. The bath was operated at room temperature (25° C.) and stirred moderately using a magnetic stirring plate. Using this bath, the Au substrate was strongly attacked within 40 min by etchants from the bath where it should have been protected by the printed layer. It was not possible to remove satisfactorily the Au in between the printed lines without having many defects in the regions of the Au which were printed. Changing the temperature, the concentration of KCN, the amount of oxygen dissolved in the bath, the concentration of NaOH and KCl, the pH of the bath and stirring did not lead to satisfactory Au patterns. Using ferricyanide or KI as etchants instead of KCN was neither satisfactory. Changing the conditions for inking the stamp or the printing time did not help producing satisfactory Au patterns with this etch system.

FIG. 1B corresponds to a pattern of Cu produced by evaporating 500 nm of Cu and 1 nm of Ti on a silicon wafer. The Cu-coated substrate was immersed in HCl (4% in volume with deionized water) for 10 s to remove copper oxide which tends to form spontaneously under ambient conditions on copper surfaces. The substrate was then rinsed with deionized water, dried under a stream of nitrogen, and printed. A stamp made of poly-(dimethylsiloxane) having a pattern different than for FIG. 1A was inked for 1 min with a 0.4 mM solution of eicosanethiol in ethanol. The stamp was then dried under a stream of nitrogen and printed by hand onto the Cu substrate for 30 s. The printed Cu sample was then immersed into a KCN/oxygen etch bath having the same composition than described above. The temperature and stirring of the bath were also similar. The selectivity of the KCN/oxygen etch system is not good enough to produce defect-free Cu patterns while removing all areas of non-printed Cu.

Therefore, a new type of etch baths is provided for selectively patterning substrates having regions covered with self-assembled monolayers (SAMs), thereby controlling the etch profile. The etch bath comprises both a liquid etching solution and additives. Thus, a printed layer can be etched with a taper.

In general, substrates covered with a patterned resist layer (photoresist or other types of resist like, e.g., electron-beam resists) can be used at the condition that the additive prefers to interact with the respective resist rather than with the bare substrate.

The etchants species are present in the bath at a concentration relatively high as compared to the additives (e.g., 200 times more concentrated, however, the invention is not restricted to this value). The additives, depending on their nature, can have different effects during etching. Some additives like, e.g., octanol, block defects in a monolayer of, e.g., eicosanethiol microcontact printed on Au. Some additives like potassium laurate slow down the etch by forming a thin film on the substrate and on the covered regions. Some additives like hexadecanethiol increase the selectivity of the etch at low concentration but block the etch everywhere at higher concentration in the etch bath. Finally, when hexadecanethiol and surfactants such as, e.g., polyethylene glycol derivatives are both dissolved in the etch bath, a competition between etching and increased protection takes place. By selecting carefully the composition of the bath in this case, it is possible to use hexadecanethiol to (i) improve the protection of the printed monolayer and to (ii) form progressively during the etch a layer adjacent to the printed layer, thus forming a taper.

By controlling very precisely the concentration of, e.g., hexadecanethiol in the etch bath it is possible to enhance the blocking properties of the SAM without blocking the etching of the bare metal. However, in case there is not enough additive present, it does not help, in case there is too much, it will block entirely the bare metal. If there is too much of, e.g., hexadecanethiol, it can also accumulate inhomogeneously and form droplets in the etch bath, which can easily block the etching of some parts of the sample but not some other parts. Since the solubility of molecules such as hexadecanethiol is very low in aqueous solutions, it is important to add surfactants to the etch bath to solubilize hexadecanethiol, for example, to ensure an homogeneous distribution of this additive in the etch bath. An additive such as hexadecanethiol can be present in the etch bath at a concentration between about 0.005 and about 0.05 mM for example together with a surfactant such as hexa(ethylene glycol) monododecylether ($C_{12}PEG_6$) at a concentration typically between about 0.5 and about 10 mM. Typically, the concentration of the surfactant should be several times its critical micellar concentration in the etch bath.

The etching system may employ a cyanide/oxygen system as discussed above and is particularly selective for substrates covered locally with SAMS, and, with tuning the composition of the bath for a given concentration of etchants in the bath, i.e., changing the concentration of the additives, the angle of the edge of the etched structures can be controlled, leading to controlling the taper of the structures. The additive should have some affinity for the SAM-covered regions and a less good affinity for the bare regions of the substrate: the additive should tend to accumulate over the SAM or insert into defective regions of the SAM. Furthermore, the additive should prevent or retard the etch by acting like a physical barrier against etchants. Typically, molecules with alkyl chains and small, polar headgroups could be useful additives because they can form dense and well packed layers on surfaces. However, it is important to realize that additives which are good surfactants or too concentrated can create a bad effect: they can remove molecules from the SAM by solubilizing them into the etch bath. Some surfactant additives also block easily the etch everywhere.

Linear molecules with an alkyl chain and a polar headgroup like long chain alcohols, long chain acids, long chain amines, long chain sulfates, long chain sulfonates, long chain phosphates, long chain nitrites, long chain phosphonic acids, and long chain alkanethiols are preferred. Molecules with a long alkyl chain and a polar headgroup are preferred because of their ability to self-assemble on surfaces and to form lateraly expanding layers. This ability depends also on the nature of substrate. Long chain, in the present case, means 8 and more carbon atoms.

It is possible to form SAMs on substrates such as Au, Cu, Ag, $Al_2O_3$ (aluminum oxide), Pt, Pd, Ni-oxide, mica, Hg, graphite, tantalum oxide, ITO (indium/tin/oxide), IZO (indium/zirconium/oxide), superconducting materials having an oxide at their surface, glass and silicon oxide in general, and Si—H (Si hydrogen-terminated). In such a case, the additive in the etch bath should not cross-react with the etchants nor with the molecules used to form the SAM.

Too short alkanethiols do not protect enough gold, silver or copper from etchants because they make too disordered or too thin SAMs and they are not very stable on the surface. Too long alkanethiols have their chain coiling or disordered instead of being ordered with chains of neighbouring molecules. Similarly, preferred alkanethiol additives are linear with the formula $HS-(CH_2)_{(n-1)}-CH_3$ and $6<n<24$. These thiols are typically poorly soluble in aqueous etch baths and require the presence of an appropriate surfactant to solubilize them in a homogeneous manner in the etch bath.

Perfluoroalkylthiols have also good protective properties and can be used as additives. These thiols include fluorine atoms instead of some hydrogen. They can have the formula $CF_3-(CF_2)_{(n-3)}-CH_2-CH_2-SH$ or $CF_3-(CF_2)_{(n-3)}-CO-NH-CH_2-CH_2-SH$ or $CF_3-(CH_2)_{(n-1)}-SH$. These compounds typically show very bad solubility in aqueous solutions and the presence of a surfactant to help solubilizing them in the bath would be necessary.

Disulfides form SAMs on Au, Ag and Cu in a similar way than alkanethiols do. Disulfides can be used as additives. The disulfides can be symmetric (both chains the same) or asymmetric (different length of the chains and/or different chemical groups). Typically, disulfide additives having polar groups at the end of their alkyl chains, such as hydroxyl, amine, nitrile, carboxylic acid, or a salt of an organic or inorganic acid, are also useful.

The additives may be added separately from the etch bath. For example, the substrate covered with a patterned SAM can be immersed in a solution containing the additive alone, and then subsequently immersed into an etch bath. It is also possible to immerse the substrate covered with a patterned SAM into a solution containing the additive and a surfactant before immersing it into a bath containing only the respective etchants. It is possible as well to repeat alternatively the immersion of the substrate in a bath with additives, then in the etch bath, then in the bath with additives again, and so on. These methods are advantageous as they permit the use of solvents to solubilize the additives which may not be compatible with the etchants or the etch bath. These methods allow also for a precise dosing of the amount of additives added to the regions of the SAMs independently of the etch duration.

It is also possible to amplify the patterned SAM by grafting or adding material on it to enhance its protective properties. If the patterned SAM possesses a reactive group at the SAM-air interface, it is possible to link an additive to the upper part of this SAM to increase its thickness and etch resistance. This can be done by microcontact printing the linking additive where desired (on a subpart of the patterned SAM) or everywhere if this additive does not react adversarily with the bare substrate. If the later condition is respected, it is possible to spray the linking additive on the substrate having the patterned SAM or to add it from solution. It is possible to amplify the protective character of the SAM by adding several layers made of the same or different crosslinkers. This crosslinker can react or interact with the SAM as to form a second layer. The same or a different crosslinker can be added as a third layer. These operations can be repeated to lead to a multilayered protective film using the original SAM as a template. These methods are advantageous to improve the protective properties of the original SAM.

It is possible to employ the etch bath having the additive at various temperatures to influence the etch rate but also to vary the solubility of the additive in the etch bath, if necessary.

The concentration of the carrier is not very critical but it is very benefitial to have some. This makes the system much more stable. Adding no carrier can easily lead to adverse effects (variable solubility of the additive, accumulation of the additive in some parts of the bath tank or on some areas of the sample, problem with variations of the bath temperature, evaporation of the additive from the bath, formation of a thin layer at the surface of the bath by the additive and pollution of samples during their immersion into the bath, etc.).

For etching Cu with microcontact printed SAMs using a KCN/oxygen etch bath and hexadecanethiol as an additive, the preferred carrier is non-ionic, e.g., hexa(ethyleneglycol) ($C_{12}PEG_6$). It was found that at least 0.5 mM was necessary and the concentration was increased up to about 10 mM. Changing the concentration of this carrier is possible (e.g., from 0.5 mM up to 10 nM); a concentration of 2 mM of $C_{12}PEG_6$ is preferred.

In general, the surfactant has a composition X-Y where X is polar and Y is nonpolar. X can be neutral, negatively charged or positively charged. In addition, X should not interact strongly with the substrate, i.e., it should not etch or oxidize the substrate, and it should not chemisorb or physisorb onto the substrate as well. Furthermore, X should not accumulate over the substrate to such an extend that it blocks or hinders access to the substrate by the etchants and blockers used.

Other surfactants than $C_{12}PEG_6$ can also be used like anionic surfactants, cationic sufactants, zwitterionic surfactants or nonionic detergents. Sodium dodecyl sulfate and potassium laurate are examples of anionic surfactants.

Cetyldimethylethylammoniumbromide is an example of a cationic surfactant. N-decyl-N,N-dimethyl-3-ammonium-lpropanesulfonate is an example of a zwitterionic surfactant. Tween (registered trademark of ICI Americas Inc.) compounds (polyoxyethylene sorbitan-based surfactants), Triton (a registered trademark of Union Carbide Corporation) N- and X-type of compounds (both series are polyoxyethylene derivatives and hexa(ethylene glycol) monododecylether are examples of nonionic surfactants.

As a blocker, hexadecanethiol is preferred. Its concentration is very important. There is a clear gain in selectivity of the etch when the concentration is higher than about 0.005 mM and this gain improves when the concentration is increased up to 0.03 mM. Then, at higher concentrations, the selectivity does not seem to change and the taper starts to form: the taper varies and tends to flatten when the concentration of hexadecanethiol approaches 0.07 mM. At higher concentrations, the whole surface starts to become blocked.

The scanning electron microscope images in FIG. 2 show the result of immersing a microcontact printed Cu substrate using an etch bath having high selectivity and giving control of the profile of the etched structures. The substrate was prepared by first evaporating 1 nm of Ti on a Si wafer and by subsequently evaporating 500 nm of Cu. The Cu-coated substrate was immersed in HCl (4% in volume with deionized water) for 10 s to remove copper oxide which tends to form spontaneously under ambient conditions on copper surfaces. The substrate was then rinsed with deionized water, dried under a stream of nitrogen, and printed. A micropatterned stamp made of poly(dimethylsiloxane) was inked for 1 min with a 0.4 mM solution of eicosanethiol ($HS-(CH_2)_{19}-CH_3$) in ethanol. The stamp was then dried under a stream of nitrogen and printed by hand onto the Cu substrate for 30 s. The printed Cu sample was then immersed in a bath composed of 3.725 g of KCl, 0.480 g of NaOH, 6.5 g of KCN, and 0.9 g (0.2 mM) of hexaethylene glycol monododecylether ($C_{12}PEG_6$) per liter of deionized water. The resulting solution had a pH of about 12 and was stirred before adding 5.2 mg (0.02 mM) of hexadecanethiol. The bath was stirred for one hour before using it. The printed Cu sample was etched for 36 min in this bath at room temperature (about 25° C.). As visible in FIG. 2A, the printed Cu structures were etched with excellent selectivity and in FIG. 2B, the taper of about 15° (500 nm height difference over a 2 mm length) of the Cu structure is clearly visible.

Figure 3B:
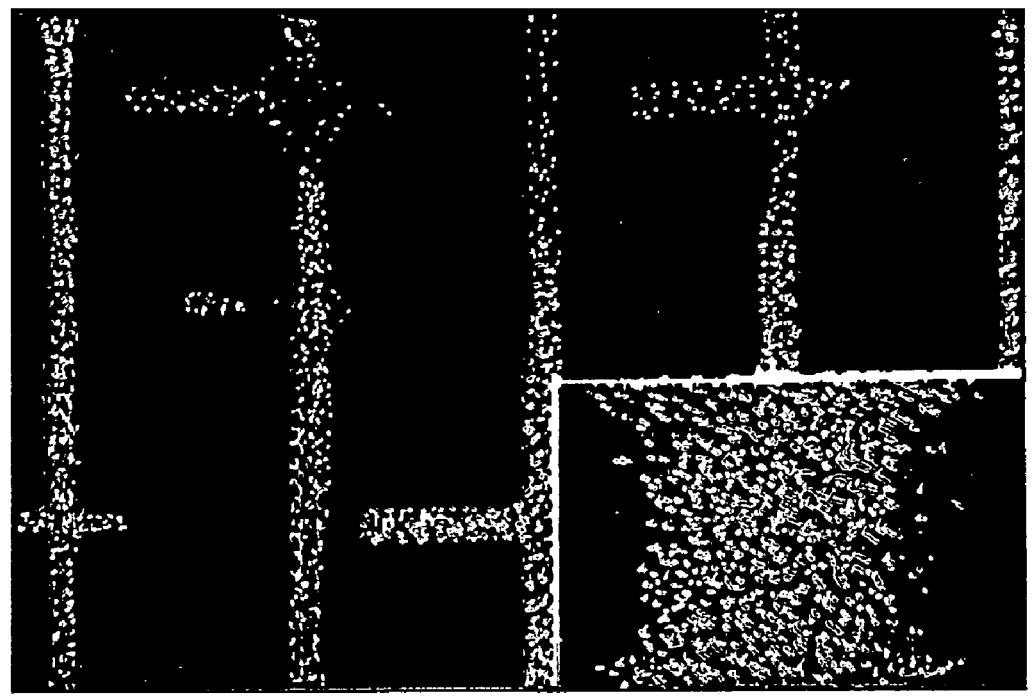

FIG. 3 shows SEM images depicting the result of patterning Au with microcontact printing eicosanethiol with a micropatterned PDMS stamp and etching the Au substrate in an $CN^-/O_2$ bath with and without octanol. The etch bath containing octanol has a concentration of octanol corresponding to half-saturation. The substrate was 15 nm of Au, e-beam evaporated onto a silicon wafer, the print lasted for 3 s and the etch duration was 5 min in all cases. Inking the stamp with a solution of 0.02 mM eicosanethiol in ethanol does not provide (a) any protection to Au except when (b) octanol molecules are present in the etch bath. Increasing the concentration of eicosanethiol up to 0.2 mM in ethanol (c) improves imperfectly the protection of the Au substrate but (d) provides a perfect etch resistance with the help of octanol present in the etch bath. The homogeneous dark background in the images corresponds to Si and indicates that octanol did not prevent the dissolution of nonprinted Au regions. The insets in the figure reveal better defects, if any, in the printed Au lines.

Copper represents a very important substrate in technology in general. When considering the etching of copper substrates protected with SAMs, a combination of two chemicals can be used. The first, 3-nitrobenzenesulfonic acid (sodium salt), which is abbreviated "NBSA", binds to copper and oxidizes it. The resulting complex is not well soluble in the etch bath. The second chemical, polyethyleneimine (PEI), is a good complexing agent of copper ions and thereby replaces the NBSA. Subsequently, PEI solubilizes the oxidized copper atoms and carries them away from the copper surface. Best results are obtained with a large, branched PEI molecule. Using this etch chemistry, copper substrates having a thickness larger than 2.2 micrometers (in general, substrates having about 1000 times the thickness of the SAM can be used) can be etched with high selectivity. This thickness is considerable when considering that the protective film is an imperfect layer of molecules which is thinner than 2.5 nm. Additives as described with the KCN/Oxygen etch chemistry above may be used with this etch bath as well to thereby increase selectivity and/or control the taper. The etch system described here may also work for other substrates than copper.

The scanning electron microscope images in FIG. 4 correspond to evaporated Cu (FIG. 4A) and electroplated Cu (FIG. 4B) microcontact printed and wet etched using NBSA and PEI. The high selectivity of this etch system is key in obtaining excellent protection of the high-resolution Cu pattern in FIG. 4A or thick and rough Cu in FIG. 4B.

100 nm of Cu was evaporated on 1 nm of Ti on a silicon wafer (FIG. 4A). Before printing, the Cu substrate was immersed for 10 s in a 4% (per volume) solution of HCl in deionized water to remove the copper oxide forming on the substrate when exposed to ambient conditions. A micropatterned stamp made of poly-(dimethylsiloxane) was inked for 1 min with a 0.4 mM solution of eicosanethiol in ethanol. The stamp was then dried under a stream of nitrogen and printed for 30 s by hand onto the Cu substrate. The printed Cu substrate was immersed in an etch bath composed of: 11.25 g of 3-nitrobezenesulfonic acid (sodium salt) and 225 g of poly(ethyleneimine) (branched type of polymer and molecular weight about 600 as measured per gel permeation chromatography), both dissolved in deionized water to a total volume of one liter. The sample was etched for about 12 min in this bath at about 60° C. and then rinsed with deionized water and dried with a stream of nitrogen.

The Cu layer in FIG. 4B was electroplated on a Au covered silicon substrate using a current density of 0.3 $A/cm^2$ and a "copper Gleam 2001" electroplating bath (from LeaRonal, Littau, Switzerland). The resulting Cu was 2 mm thick and had a roughness noticeably larger than the one of evaporated or sputtered Cu of similar thickness. The copper oxide present on the surface of the copper was removed by immersing the sample in a 4% (per volume) solution of HCl in deionized water for 10 s. The sample was dried with a stream of nitrogen and printed for 40 s using a micropatterned stamp made of poly(dimethylsiloxane) which was inked for 1 min with a 0.4 mM solution of eicosanethiol in ethanol and dried with a stream of nitrogen. The printed Cu substrate was immersed into an etch bath having the same composition than the composition used in FIG. 4A. The bath was maintained at a temperature of 80° C. using a jacketed glass vessel and was strongly stirred. The etch of the printed Cu substrate was 45 min.

Figure 5:
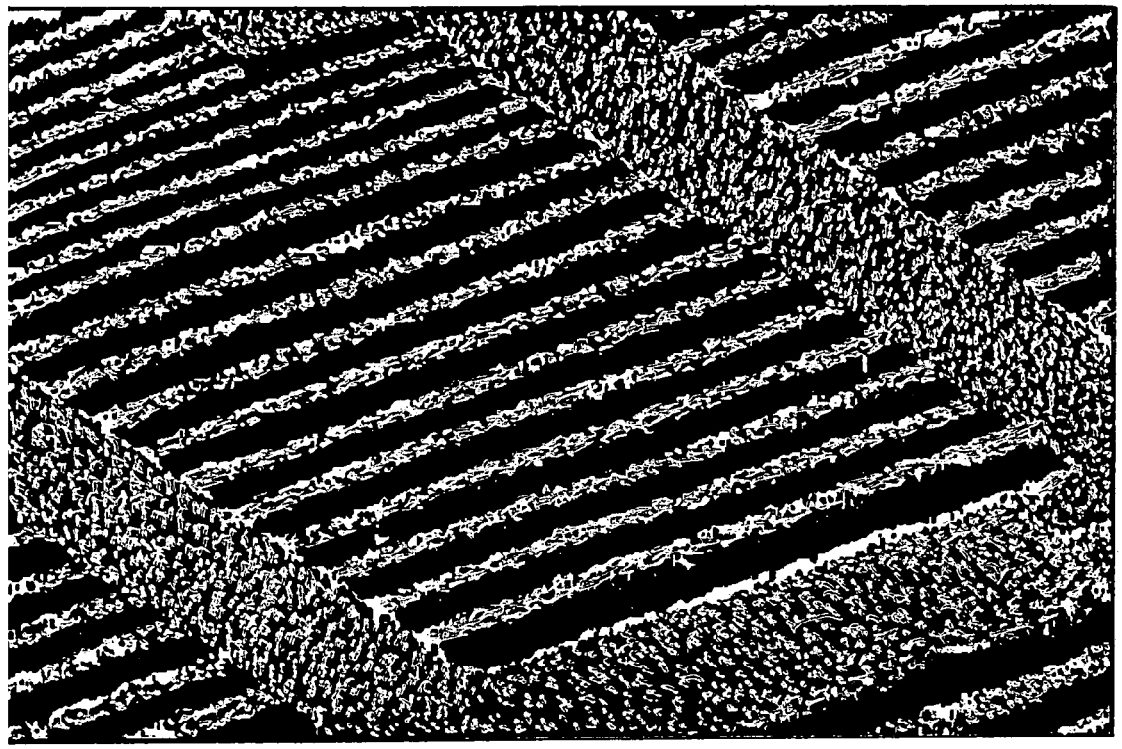
FIG. 5 is a scanning electron microscope image showing the possibility of printing and etching the same Cu substrate several times consecutively to form complex, three-dimensional Cu patterns using a selective etch according to the invention.

The scanning electron microscope image in FIG. 5 illustrates how a selective etch of a printed Cu substrate allows for multiple printing and etching operations on the same substrate to form complex Cu structures. The 1 mm thick Cu layer was evaporated on 1 nm of Ti on a silicon wafer. The oxide forming under ambient conditions on the Cu substrate was removed before printing by immersing the sample in a 4% (per volume) solution of HCl in deionized water for 10 s. The sample was then rinsed with deionized water and dried with a stream of nitrogen. A first micropatterned poly(dimethylsiloxane) stamp was inked for 1 min with a 0.4 mM solution of eicosanethiol in ethanol and dried with a stream of nitrogen. The stamp was then printed onto the Cu substrate for 1 min. Subsequently, the Cu sample was partially etched with a bath containing NBSA and PEI with the same composition than indicated in FIG. 4. The etch proceeded for 20 min at 80° C. and the partially etched sample was removed from the bath, rinsed with deionized water and dried with a stream of nitrogen. The sample was then printed a second time using a second stamp inked similarly to the first stamp. The second stamp was printed for 1 min 30 s and the sample was re-immersed into the NBSA/PEI etch bath for 20 min to remove the Cu which was not printed.

The invention claimed is:

1. A wet etching system for selectively patterning substrates having regions covered with self-assembled monolayers (SAMs), thereby controlling the etch profile, said system comprising:
   a) a liquid etching solution comprising a KCN/Oxygen etching composition; and
   b) at least one nonpolar additive comprising a compound which is a perfluoroalkylthiol and is adapted to form an ordered layer on said substrate, added to said liquid etching solution having a higher affinity to the regions of said substrate covered with SAMs than to the other regions of said substrate.

* * * * *